United States Patent
Nakazawa et al.

(10) Patent No.: US 7,041,977 B2
(45) Date of Patent: *May 9, 2006

(54) ELECTRON MICROSCOPE

(75) Inventors: Eiko Nakazawa, Mito (JP); Isao Nagaoki, Hitachinaka (JP)

(73) Assignees: Hitachi, Ltd., Tokyo (JP); Hitachi Science Systems, Ltd., Hitachinaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/052,200

(22) Filed: Feb. 8, 2005

(65) Prior Publication Data

US 2005/0145792 A1 Jul. 7, 2005

Related U.S. Application Data

(63) Continuation of application No. 10/098,774, filed on Mar. 19, 2002, now Pat. No. 6,875,983.

(30) Foreign Application Priority Data

May 25, 2001 (JP) .............................. 2001-157405

(51) Int. Cl.
*H01J 37/26* (2006.01)
(52) U.S. Cl. ...................................... 250/311; 250/306
(58) Field of Classification Search .................... None
See application file for complete search history.

(56) References Cited

U.S. PATENT DOCUMENTS

| | | | | |
|---|---|---|---|---|
| 4,451,737 A | * | 5/1984 | Isakozawa | 250/311 |
| 5,393,977 A | * | 2/1995 | Okura et al. | 250/306 |
| 6,442,296 B1 | | 8/2002 | Smith et al. | |
| 6,875,983 B1 | * | 4/2005 | Nakazawa et al. | 250/311 |

FOREIGN PATENT DOCUMENTS

| | | |
|---|---|---|
| EP | 0-573-891 A | 12/1993 |
| EP | 1-128-413 A | 8/2001 |
| JP | 1-239743 | 9/1989 |
| JP | 10-283969 | * 10/1998 |
| JP | 11-067136 | 3/1999 |
| JP | 11-146308 | 5/1999 |
| JP | 2000-023918 | 1/2000 |

OTHER PUBLICATIONS

European Search Report dated Sep. 16, 2002.

* cited by examiner

*Primary Examiner*—Nikita Wells
*Assistant Examiner*—James P. Hughes
(74) *Attorney, Agent, or Firm*—Dickstein Shapiro Morin & Oshinsky LLP

(57) ABSTRACT

An object of the present invention is to provide an electron microscope that is capable of improving work efficiency when restarting sample observation. A control unit for controlling observation-condition setting devices, which include an electron-gun control unit, an irradiation-lens control unit, an objective-lens control unit, a magnifying-lens-system control unit, and a sample-stage control unit, is provided. When image data of a certain sample is specified, observation condition data of the sample is retrieved. Then, observation conditions, which are the same as those used when the image data of the sample has been saved, are automatically restored on an electron microscope on the basis of the observation condition data. As a result, an image, which is the same as the stored image, is restored faithfully.

5 Claims, 2 Drawing Sheets

ELECTRON MICROSCOPE

CROSS-REFERENCE TO RELATED APPLICATION

This application is a continuation of U.S. patent application Ser. No. 10/098,774, filed on Mar. 19, 2002, which issued as U.S. Pat. No. 6,875,983, on Apr. 5, 2005. The subject matter of which is incorporated in its entirety by reference herein.

BACKGROUND OF THE INVENTION

The present invention relates to an electron microscope that uses a method by which observation result of a sample is stored as image data, and more particularly to an electron microscope that is suitable for use in repetitive observation of the same sample.

In observation of a sample using an electron microscope, it is necessary to set observation conditions such as magnification, acceleration voltage of an electron beam, and an observation mode, which are suitable for observation of the sample, before starting the observation.

In this case, these observation conditions are set by devices that are generically called observation-condition setting devices such as a device for controlling an electron gun, a device for controlling an irradiation lens, a device for controlling an objective lens, a device for controlling a magnifying lens system, and a device for controlling a sample stage.

These observation conditions are a part of information that is indispensable to evaluation of the observation result of the sample. Therefore, when saving an image, it is desirable to save observation conditions of the recorded image together with the image.

In this connection, when recording the observation result obtained by the electron microscope as an image, either of the following methods is generally conventionally used: a method in which the observation result is saved in an image recording medium, such as a photographic film, as a real image: and a method in which the observation result is saved in a memory as image data by a TV camera (Television Camera).

With both of the methods described above, it is possible to record the observation conditions together with the recorded image. However, if the observation conditions are recorded on a film, it is difficult to record all observation conditions because a writing area is limited. On the other hand, in the case of the image data by a TV camera, there is no hard problem of a writing area. Therefore, the observation conditions can also be displayed immediately in real time together with the image.

In the prior art, for example, while observing a certain sample, if the observation is interrupted for some reason, but an operator tries to start the observation again, the following operation is required: displaying observation conditions together with an image using the recording method for image data; and while watching the displayed observation conditions, providing an electron microscope with each condition setting by manual operation with reference to the observation conditions.

The prior art described above has a problem in work efficiency because settings of the observation conditions when restarting the observation are not taken into consideration.

As described above, when using an electron microscope, it is necessary to set desired observation conditions in response to a sample to be observed. This requires considerably complicated work.

The reason why complicated work is required for the settings of the observation conditions is that as described above, the observation conditions cover a wide variety of conditions: that is to say, in addition to magnification and acceleration voltage, there are many observation modes including, for example, a diffraction mode, a high resolution mode, a high contrast mode, and an extremely low magnification mode.

When starting observation of a certain sample, it is natural that complicated work is required. In other words, it is unavoidable. However, in the prior art, even if the same sample is observed, settings of the observation conditions by manual operation is required for each observation-condition setting device every time the work is started. This causes work efficiency to be decreased.

SUMMARY OF THE INVENTION

An object of the present invention is to provide an electron microscope that is capable of improving work efficiency when restarting observation of the sample.

According to an aspect of the present invention, the object described above can be achieved by an electron microscope using a method by which observation condition data of a sample is saved while the observation condition data is associated with image data of the sample so that both data are in a one-to-one correspondence, the microscope comprising; a control means for controlling an observation-condition setting means of the electron microscope is provided; wherein when image data of a certain sample is specified, the control means retrieves observation condition data of the sample; and on the basis of the observation condition data retrieved, the control means controls the observation-condition setting means so that observation conditions correspond to the same as those used when the image data of the sample was saved.

The image data may be saved as TIF format data that includes a tag area; and the observation condition data may be saved in the tag area. In like manner, in addition to magnification and acceleration voltage as the observation conditions, the observation conditions may also include one of observation modes, that is to say, one of a diffraction mode, a high resolution mode, a high contrast mode, and an extremely low magnification mode. Moreover, the observation conditions may also include at least a coordinate position of a sample stage.

According to the present invention, a recorded image can be associated with observation conditions of the image completely. In addition, the observation conditions as feedback are automatically given to the electron microscope concurrently with displaying of the recorded image. Therefore, it is possible to faithfully restore the recorded image on the electron microscope with ease.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
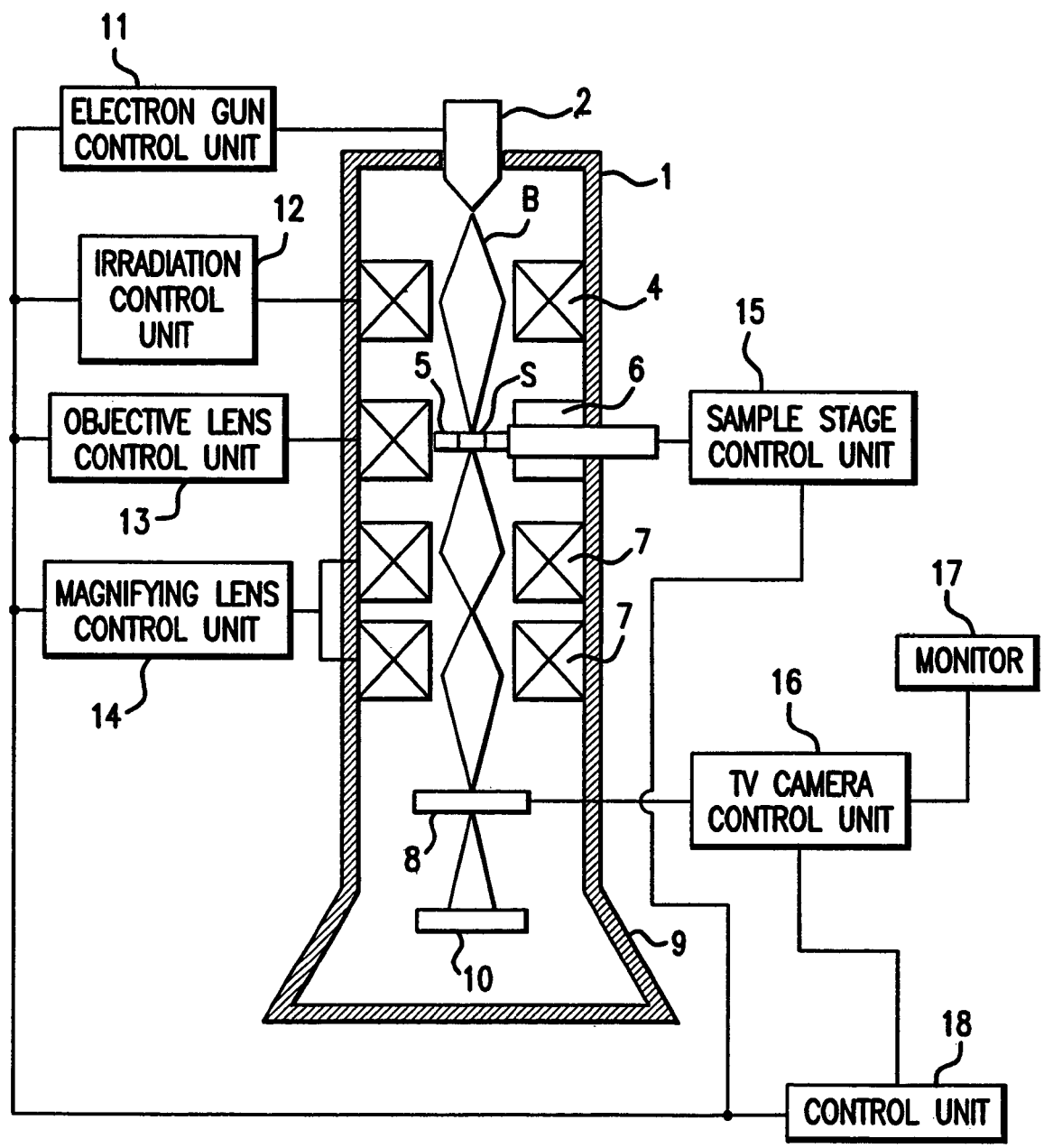
FIG. 1 is a schematic configuration diagram illustrating one embodiment of an electron microscope according to the present invention.

An electron microscope of an embodiment according to the present invention, which is shown in FIG. 1, will be described in detail as below.

FIG. 1 is one embodiment in which the present invention is applied to a transmission electron microscope, As described in the figure, an electron gun 2 is mounted on the upper end (in the figure) of an electron-microscope main body 1. It is so devised that an irradiation lens 4 irradiates a sample S held on a sample stage 5 with an electron beam B that is emitted by this electron gun 2.

Then, the electron beam B, which has been transmitted through this sample S, is magnified by an objective lens 6 and a magnifying lens system 7 before the magnified electron beam B is projected on a TV camera 8. In this case, the electron gun 2 is controlled by an electron-gun control unit 11; the irradiation lens 4, the objective lens 6, and the magnifying lens system 7 are controlled by an irradiation-lens control unit 12, an objective-lens control unit 13, and a magnifying-lens-system control unit 14 respectively; and the sample stage 5 is controlled by a sample-stage control unit 15.

Therefore, these devices, that is to say, the electron-gun control unit 11, the irradiation-lens control unit 12, the objective-lens control unit 13, the magnifying-lens-system control unit 14, and the sample-stage control unit 15, serve as observation-condition setting devices.

The TV camera 8 comprises a scintillator plate, and an image pickup device such as CCD. The TV camera 8 converts the electron beam B, which is projected on the image pickup element, into light to detect a signal on a pixel basis. Then, the TV camera 8 supplies the detected signal to a TV-camera control unit 16 to convert the signal into a time-series image signal. After that, this image signal is supplied to a monitor 17 where the image signal is displayed as an image. In addition, the same image signal, which has been output from the TV-camera control unit 16, is also supplied to a control unit 18 where the image signal is stored and saved in a memory as image data.

A lower end portion of the electron-microscope main body 1 forms a camera chamber 9, in which a fluorescent plate 10 is mounted. Therefore, using a mechanism, which is not illustrated in the figure, to remove the TV camera 8 from a path of the electron beam B enables us to observe an enlarged image of the sample S, which is obtained by the electron beam B, on a surface of the fluorescent plate 10.

By the way, the configuration described above is not so different from that of a general electron microscope. However, the present invention is largely different from the prior art on the following point: in this embodiment, each of the observation-condition setting devices of the electron microscope, that is to say, the electron-gun control unit 11, the irradiation-lens control unit 12, the objective-lens control unit 13, the magnifying-lens-system control unit 14, and the sample-stage control unit 15, are coupled to the control unit 18 through a predetermined transmission line in order to permit data to be transmitted and received mutually, with the result that the control unit 18 can set observation conditions.

Because of it, the control unit 18 is configured to have, for example, a computer into which a predetermined program is loaded. This enables generation of control data that is required to control the observation-condition setting devices by supplying the control data to the devices.

In the next place, operation will be described with reference to a flowchart in FIG. 2. To begin with, in this embodiment, two kinds of processing, that is to say, "image record processing" and "image retrieval processing" are executed by the control unit 18.

In this case, the "image record processing" is processing used when a certain desired sample is observed. On the other hand, the "image retrieval processing" is processing used for the following case: after the observation of the certain desired sample is finished, the same part of the sample image for the same sample is restored for observation using the same observation conditions as those in the previous observation.

Figure 2:
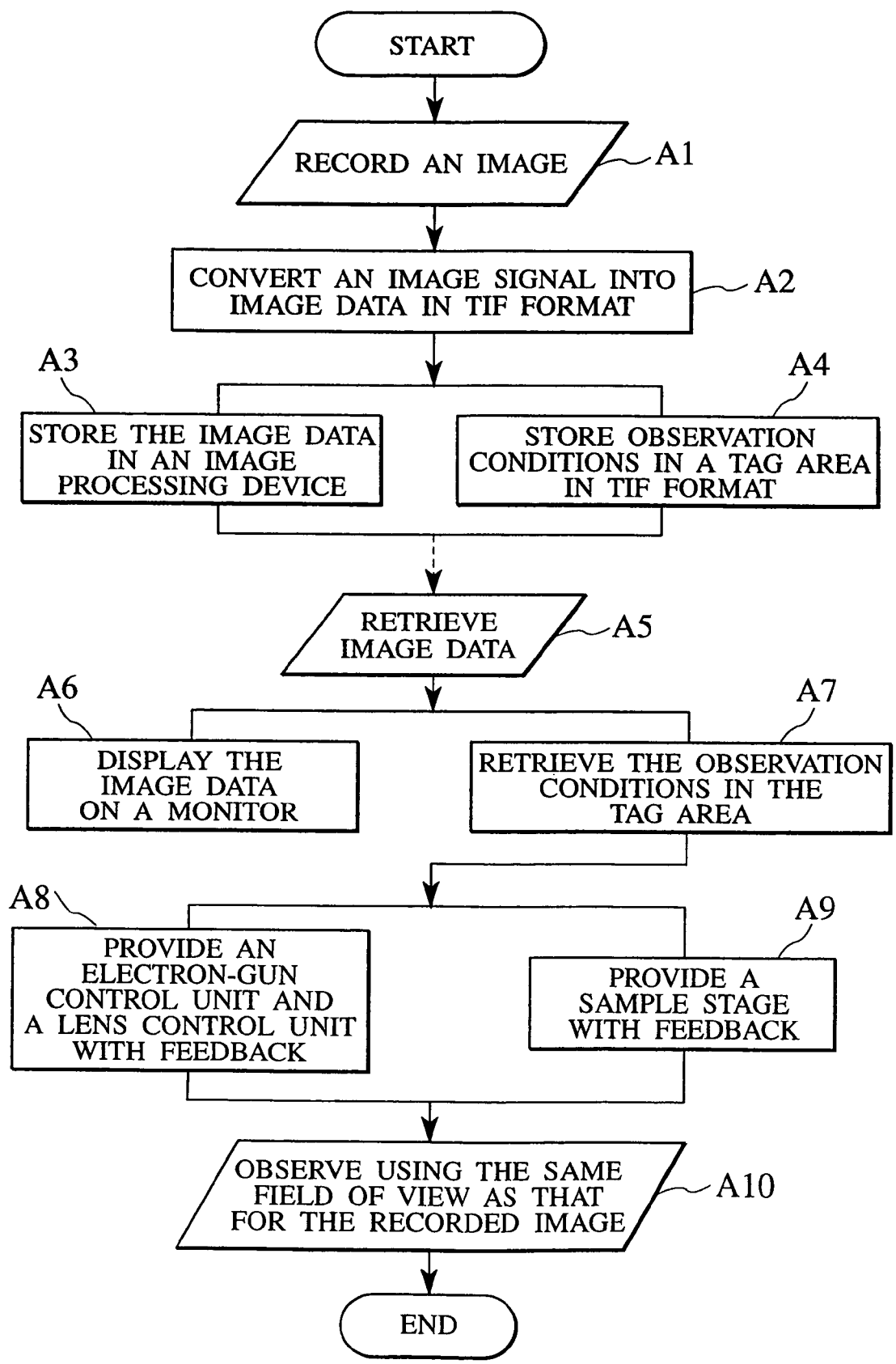
FIG. 2 is a flowchart illustrating operation in one embodiment according to the present invention.

In the flowchart shown in FIG. 2, processing A2 through A4, which follows processing A1, is the image record processing; and processing A6 through A9, which follows processing A5, is the image retrieval processing. The processing is executed by the control unit 18 according to an instruction from an operator.

First of all, the "image record processing" will be described. In the beginning, the operator prepares a sample S as an observation target, and then operates the electron microscope to set predetermined observation conditions so that an enlarged image of a predetermined part of the sample S is picked up by the TV camera 8. In this case, the operator operates the electron microscope while watching the enlarged image of the sample S displayed in the monitor 17. The operator may watch an image in the fluorescent plate 10 as a matter of course.

Operation for this case is not shown in FIG. 1. The operation is performed using a predetermined input device such as a keyboard for example. Predetermined control data is input into the electron-gun control unit 11, the irradiation-lens control unit 12, the objective-lens control unit 13, and the magnifying-lens-system control unit 14 so that desired acceleration voltage and magnification, and a desired observation mode, can be obtained.

In addition to it, control data is also inputted into the sample-stage control unit 15 in order to move the sample stage 5 so that a desired part of the sample S comes into a field of view for observation. As a result, an image corresponding to the desired part (coordinates) is obtained for the desired sample S on the basis of the desired observation conditions.

Therefore, if the processing ends here, the processing is the same as that for the case of observation using a general electron microscope. However, in this embodiment, after the image corresponding to the desired part is obtained for the desired sample S on the basis of the desired observation conditions, the operator executes predetermined operation required to instruct the control unit 18 to record this image (step A1). It is to be noted that the operation is also performed using a predetermined input device such as a keyboard.

After that, to begin with, the control unit 18 converts an image signal, which has been captured from the TV camera 8, into data in TIF format (TIFF) (step A2). Then, the image data, which has been converted into the TIF format, is stored and saved in a memory (step A3).

On the other hand, in parallel with the save of this image data, the control unit 18 captures observation conditions of the image as data from the electron-gun control unit 11, the irradiation-lens control unit 12, the objective-lens control unit 13, and the magnifying lens control unit 14. In addition, a coordinate position of the sample S being observed is also captured as data from the sample-stage control unit 15.

Then, data, which expresses these observation conditions and the coordinate position, is stored in a tag area in TIF format as tag data of the image data (step A4). Therefore, according to this embodiment, as a result of execution of the "image record processing", when a certain desired sample is observed, observation conditions of the image are entirely stored and saved in the tag area in TIF format together with the image data.

As a result of the processing described above, after observing the certain sample, reading its image data permits the observation conditions of the Image to be read as data together with the image data.

Next, the "image retrieval processing" will be described. The image retrieval processing is started by the following operator's operation: selecting a certain desired sample; mounting the selected sample on the sample stage 5 as the sample S; and inputting a predetermined instruction into a control unit 18. In this case, the predetermined instruction specifies the image data, which has already been saved as TIF format by the image record processing described above, relating to the selected sample S.

Therefore, the image retrieval processing can be performed only when image data of the desired sample has already been saved in TIF format by the image record processing. Such a situation includes, for example, the following case: while observing a certain sample, the observation is interrupted for some reason, and then the observation of the same sample is started again.

In this manner, when the image retrieval processing is started, image data of the specified sample is retrieved by the control unit 18 (step A5). After that, the control unit 18 supplies this image data to the monitor 17 to display the saved observation image on a monitor screen (step A6). As a result of it, the operator can check whether or not desired image data has been retrieved correctly. In this case, observation conditions and a coordinate position of the corresponding sample are additionally saved in the tag area of the image data in TIF format as tag data.

Then, the control unit 18 reads the tag data from the image data (step A7), and supplies data expressing observation conditions, such as acceleration voltage and magnification, in this tag data to the electron-gun control unit 11 and to each of lens control units 12 through 14 as feedback for control (step A8).

To be more specific, each corresponding control data in the tag data is inputted into each of the electron-gun control unit 11, the irradiation-lens control unit 12, the objective-lens control unit 13, and the magnifying-lens-system control unit 14. The control units control each element so that acceleration voltage and magnification, which are specified by the tag data, are obtained, and an observation mode (for example, a diffraction mode, a high resolution mode, a high contrast mode, and an extremely low magnification mode) is also obtained.

In addition, the data expressing a coordinate position in the tag data is supplied to the sample-stage control unit 15 to provide feed back for control in a similar manner (step A9). To be more specific, the coordinate position data in the tag data is inputted into the sample-stage control unit 15 to move the sample stage 5 so that a part specified by the tag data of the sample S comes into a field of view for observation.

As a result of it, in the case of this embodiment, specifying image data of the sample permits the electron microscope to be automatically set in the same observation conditions as those used when the image data of the sample has been saved. In addition, the sample stage 5 is also automatically set at the same coordinate position.

Therefore, according to this embodiment, for example, even if observation of the sample S is interrupted for some reason, when the observation of the same sample S is started again after that, it is possible to restore a state of the electron microscope automatically immediately; in this case, the state is the same as that at the time of the interruption. As a result, the observation can be performed with efficiency.

In the prior art, for example, observation conditions are stored while the observation conditions are linked to a stored location corresponding to image data of a predetermined holder. However, if the image is moved to another PC (personal computer) or another recording medium, the link data is separated. As a result, it is substantially impossible to retrieve the observation conditions from the image.

However, since in the embodiment described above image data is converted into data in TIF format, and observation conditions are stored in a tag area, corresponding observation conditions are always saved without fail. In addition to it, retrieving image data permits corresponding observation condition data to be obtained at the same time. Moreover, since there is no strict limitation of the quantity of data that can be saved, it is easy to completely restore observation conditions.

Although the embodiment described above relates to the case where the present invention is applied to the transmission electron microscope, it is needless to say that the present invention can be applied to the other electron microscopes such as a scanning electron microscope, for example. In the case of the scanning electron microscope, instead of saving coordinate position data of the sample stage, coordinate data measured when irradiating a sample surface with an electron beam is stored, and thereafter feedback is given to an electron beam scanning control unit.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

The invention claimed is:

1. An electron microscope comprising:
   a control device that saves observation condition setting data and image data obtained by an observation with the electron microscope to a memory unit;
   wherein the control device converts an image signal obtained by the electron microscope into image data having a tag area and saves the image data to the memory unit and the observation condition setting data into the tag area of the image data saved to the memory unit.

2. An electron microscope according to claim 1, wherein said image data is saved as TIF format data that includes a tag area, and said observation condition setting data is saved in the tag area.

3. An electron microscope according to claim 1, wherein said observation condition setting data includes magnification and acceleration voltage and an observation mode, wherein said observation mode includes one of a diffraction mode, a high resolution mode, a high contrast mode, and an extremely low magnification mode.

4. An electron microscope according to claim 1, wherein said observation condition setting data includes at least a coordinate position of a sample stage.

5. A method of operating an electron microscope, said method comprising:
   setting an observation condition data of the electron microscope;
   obtaining an image signal from said electron microscope;
   converting said image signal with a control device into an image data having a tag area, wherein said observation condition data is saved into the tag area of said image data; and
   saving said image data and said observation condition data into a memory unit with said control device.

* * * * *